United States Patent
Kim

(10) Patent No.: US 11,619,605 B2
(45) Date of Patent: Apr. 4, 2023

(54) DISPLAY APPARATUS

(71) Applicant: SAMSUNG DISPLAY CO., LTD., Yongin-si (KR)

(72) Inventor: Seoyeon Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 380 days.

(21) Appl. No.: 16/727,086

(22) Filed: Dec. 26, 2019

(65) Prior Publication Data

US 2020/0209177 A1 Jul. 2, 2020

(30) Foreign Application Priority Data

Dec. 27, 2018 (KR) .................. 10-2018-0171130

(51) Int. Cl.
| | |
|---|---|
| *G01N 27/20* | (2006.01) |
| *G02F 1/1339* | (2006.01) |
| *G02F 1/1362* | (2006.01) |
| *G09G 3/3258* | (2016.01) |

(Continued)

(52) U.S. Cl.
CPC ............ *G01N 27/20* (2013.01); *G02F 1/1339* (2013.01); *G02F 1/136286* (2013.01); *G09G 3/3258* (2013.01); *H01L 27/3276* (2013.01); *H01L 51/5246* (2013.01); *G02F 1/136254* (2021.01)

(58) Field of Classification Search
CPC ............ G02F 1/136286; G02F 1/1339; G02F 1/136254; G02F 1/13; G02F 1/1345; G02F 1/13439; G02F 1/1309; G02F 2203/69; G02F 1/134309; G02F 1/136259; G02F 2201/121; G02F 1/13398; G02F 2202/28; H01L 27/3276; H01L 51/5246; H01L 27/1244; H01L 27/3223; H01L 27/124; H01L 23/5386; H01L 23/49838; H01L 23/528; H01L 2924/0002; H01L 2924/00; G01N 27/20; G09G 3/3258; G09G 3/3233; G09G 2300/0426; G09G 2300/0842;
(Continued)

(56) References Cited

U.S. PATENT DOCUMENTS

| | | | |
|---|---|---|---|
| 6,721,019 B2 | 4/2004 | Kono et al. | |
| 8,049,412 B2 * | 11/2011 | Kwak | ................. H01L 27/3276 313/504 |
| 8,134,677 B2 | 3/2012 | Kwon et al. | |

(Continued)

FOREIGN PATENT DOCUMENTS

| | | | | |
|---|---|---|---|---|
| CN | 104298012 A | * | 1/2015 | ........... G02F 1/1339 |
| CN | 205353529 U | * | 6/2016 | ....... G02F 1/133345 |

(Continued)

*Primary Examiner* — Hoan C Nguyen
(74) *Attorney, Agent, or Firm* — F. Chau & Associates, LLC

(57) ABSTRACT

A display apparatus includes: a first substrate including a display area and a peripheral area; a second substrate overlapping the first substrate; a sealing unit surrounding the display area and disposed between the first substrate and the second substrate; and a first resistance measuring pattern located at an upper surface of the sealing unit, and a second resistance measuring pattern located at a lower surface of the sealing unit, wherein each of the first and second resistance measuring patterns extends along edges of the first substrate and has a rectangular shape including an open side.

20 Claims, 8 Drawing Sheets

(51) Int. Cl.
*H01L 27/32* (2006.01)
*H01L 51/52* (2006.01)

(58) Field of Classification Search
CPC ..... C09J 11/04; C09J 9/02; C08K 2003/0831; C08K 2201/001; C08K 7/18; C08K 2003/0806
See application file for complete search history.

(56) References Cited

U.S. PATENT DOCUMENTS

| | | | |
|---|---|---|---|
| 2004/0227895 A1* | 11/2004 | Yoo | G02F 1/1345 349/152 |
| 2008/0002134 A1* | 1/2008 | Jeong | G02F 1/1345 349/153 |
| 2010/0134137 A1 | 6/2010 | Kida | |
| 2011/0037744 A1 | 2/2011 | Oh | |
| 2013/0141683 A1* | 6/2013 | Chen | G02F 1/1339 349/124 |
| 2014/0160413 A1* | 6/2014 | Nishida | G02F 1/134309 349/123 |
| 2017/0148375 A1 | 5/2017 | Kim et al. | |
| 2018/0120357 A1 | 5/2018 | Takenaka | |
| 2018/0210245 A1* | 7/2018 | Yao | C09J 11/04 |

FOREIGN PATENT DOCUMENTS

| | | | |
|---|---|---|---|
| JP | 2002-041231 | | 2/2002 |
| JP | 2010-020209 | | 1/2010 |
| KR | 20070048912 A | * | 5/2007 |
| KR | 10-0897157 | | 5/2009 |
| KR | 10-1073404 | | 10/2011 |

\* cited by examiner

DISPLAY APPARATUS

CROSS-REFERENCE TO RELATED APPLICATION

This application claims priority under 35 U.S.C. § 119 to Korean Patent Application No. 10-2018-0171130, filed on Dec. 27, 2018, in the Korean Intellectual Property Office, the disclosure of which is incorporated by reference herein in its entirety.

TECHNICAL FIELD

Exemplary embodiments of the present inventive concept relate to a display apparatus, and more particularly, to a display apparatus including a sealing unit and resistance measuring patterns.

DISCUSSION OF THE RELATED ART

In accordance with the rapid development in display technology for visually expressing various kinds of electrical signal information as an image, various flat display apparatuses having characteristics such as a small thickness, a light weight, and low power consumption are currently being researched and developed. When moisture or oxygen permeate into a display apparatus from the outside environment, the above-mentioned characteristics of the flat display apparatuses may be degraded. To prevent external moisture or oxygen from permeating into the display apparatuses, a display apparatus, for example, may include display devices provided between a pair of substrates facing each other, and the pair of substrates may be bonded to each other by a sealing unit that surrounds the display devices and is coated. However, a defect may occur in a sealing material of the sealing unit.

SUMMARY

According to an exemplary embodiment of the present inventive concept, a display apparatus includes: a first substrate including a display area and a peripheral area; a second substrate overlapping the first substrate; a sealing unit surrounding the display area and disposed between the first substrate and the second substrate; and a first resistance measuring pattern located at an upper surface of the sealing unit, and a second resistance measuring pattern located at a lower surface of the sealing unit, wherein each of the first and second resistance measuring patterns extends along edges of the first substrate and has a rectangular shape including an open side.

In an exemplary embodiment of the present inventive concept, the display apparatus further includes a terminal portion arranged at an edge of the first substrate in the peripheral area, wherein the terminal portion is located at the open side of the first and second resistance measuring patterns.

In an exemplary embodiment of the present inventive concept, a data drive circuit is located at the terminal portion, and the data drive circuit is configured to compare an initial resistance value of the sealing unit with a resistance value measured by using the first and second resistance measuring patterns.

In an exemplary embodiment of the present inventive concept, an end portion of the first resistance measuring pattern and an end portion of the second resistance measuring pattern are respectively electrically connected to the terminal portion.

In an exemplary embodiment of the present inventive concept, the end portion of the first resistance measuring pattern and the end portion of the second resistance measuring pattern are spaced apart from each other by a predetermined distance.

In an exemplary embodiment of the present inventive concept, the first resistance measuring pattern and the second resistance measuring pattern respectively extend from the edges of the first substrate and edges of the second substrate toward the display area.

In an exemplary embodiment of the present inventive concept, a width of the second resistance measuring pattern is less than a width of the sealing unit.

In an exemplary embodiment of the present inventive concept, the display apparatus further includes a power supply line located between the first substrate and the sealing unit, wherein the sealing unit covers a portion of the power supply line, and the second resistance measuring pattern and the power supply line are located on a same layer and are apart from each other.

In an exemplary embodiment of the present inventive concept, at least one of the first and second resistance measuring patterns includes a plurality of fragments separated from one another.

In an exemplary embodiment of the present inventive concept, the first and second resistance measuring patterns each includes a bent portion.

According to an exemplary embodiment of the present inventive concept, a display apparatus includes: a first substrate including a display area, and a peripheral area; a terminal portion disposed in the peripheral area; a second substrate disposed on the first substrate; a sealing unit located between the first substrate and the second substrate and surrounding the display area; and a first resistance measuring pattern located at an upper surface of the sealing unit, and a second resistance measuring pattern located at a lower surface of the sealing unit, wherein each of the first and second resistance measuring patterns is electrically connected to the terminal portion.

In an exemplary embodiment of the present inventive concept, the first and second resistance measuring patterns extends along edges of the first substrate and has a rectangular shape including an open side, and wherein the terminal portion is located at the open side of the first and second resistance measuring patterns.

In an exemplary embodiment of the present inventive concept, a data drive circuit is located at the terminal portion, and the data drive circuit is configured to compare an initial resistance value of the sealing unit with a resistance value measured by using the first and second resistance measuring patterns.

In an exemplary embodiment of the present inventive concept, an end portion of the first resistance measuring pattern and an end of the second resistance measuring pattern are electrically connected to the terminal portion, respectively.

In an exemplary embodiment of the present inventive concept, the end portion of the first resistance measuring pattern and the end portion of the second resistance measuring pattern are spaced apart from each other by a predetermined distance.

In an exemplary embodiment of the present inventive concept, the display apparatus further includes a power supply line located between the first substrate and the sealing unit, wherein the sealing unit covers a portion of the power supply line, and the second resistance measuring pattern and the power supply line are located on a same layer and include a same material.

In an exemplary embodiment of the present inventive concept, the first resistance measuring pattern and the second resistance measuring pattern respectively extend from edges of the first substrate and edges of the second substrate toward the display area.

In an exemplary embodiment of the present inventive concept, a width of the second resistance measuring pattern is less than a width of the sealing unit.

In an exemplary embodiment of the present inventive concept, at least one of the first and second resistance measuring patterns includes a plurality of fragments separated from one another.

In an exemplary embodiment of the present inventive concept, the first and second resistance measuring patterns each includes a bent portion.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Figure 1:
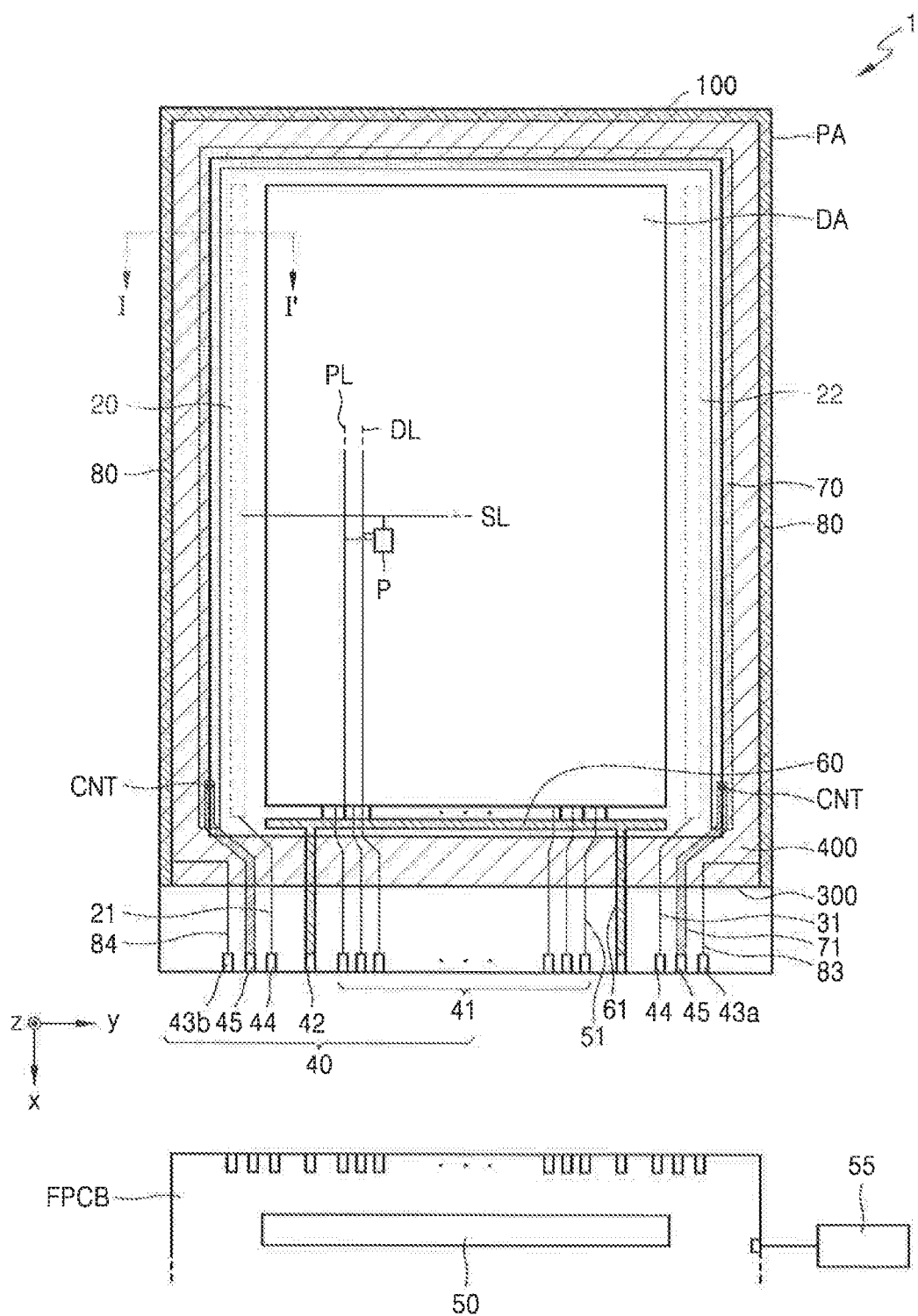
FIG. 1 is a schematic top-plan view illustrating a display apparatus according to an exemplary embodiment of the present inventive concept.

Exemplary embodiments of the present inventive concept will now be described more fully with reference to the accompanying drawings. It is to be understood that the present inventive concept may be embodied in different forms and thus should not be construed as being limited to the exemplary embodiments set forth herein.

In the following embodiments, when an element (e. g. a layer, a region, or a component) is referred to as being "on" another element, the element may be directly on the other element, or an intervening layer, region, or component may be present between the element and the other element.

Sizes of elements in the drawings may be exaggerated for clarity.

Hereinafter, exemplary embodiments of the present inventive concept will be described in detail with reference to the attached drawings, wherein like reference numerals may refer to like elements throughout. Accordingly, repetitive descriptions may not be repeated.

Figure 2:
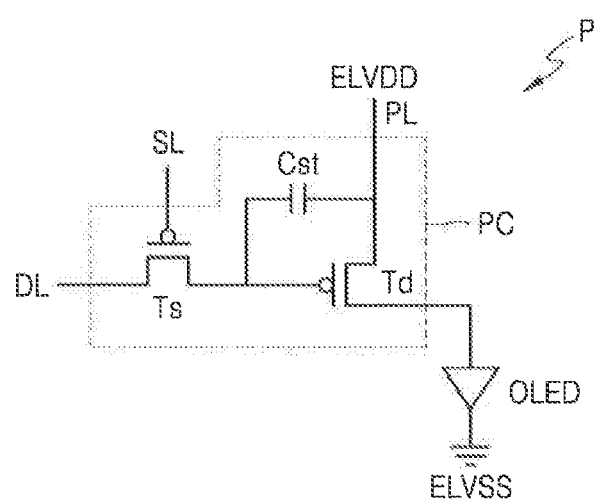
FIG. 2 is a circuit diagram of a pixel in the display apparatus according to an exemplary embodiment of the present inventive concept.

FIG. 1 is a schematic top-plan view illustrating a display apparatus according to an exemplary embodiment of the present inventive concept, and FIG. 2 is a circuit diagram of a pixel in the display apparatus according to an exemplary embodiment of the present inventive concept.

Referring to FIGS. 1 and 2, a display apparatus 1 includes a display area DA providing an image and a peripheral area PA at least partially surrounding the display area DA. For example, a first substrate 100 includes the display area DA and the peripheral area DA.

Pixels P, each of which are connected to a scan line SL and a data line DL, are disposed in the display area DA. For example, the scan line SL extends in the y direction, and the data line DL extends in the x direction that is substantially perpendicular to the y direction. Each pixel P may, for example, emit a red, green, blue, or white light. Each pixel P may include a light emitting element. For example, a light emitting element may include an organic light-emitting diode.

Referring to FIG. 2, the pixel P may include a pixel circuit PC connected to the scan line SL and data line DL, and an organic light-emitting diode OLED connected to the pixel circuit PC. The pixel circuit PC includes a driving thin film transistor Td, a switching thin film transistor Ts, and a storage capacitor Cst. The switching thin film transistor Ts is connected to the scan line SL and the data line DL and delivers a data signal input through the data line DL to the driving thin film transistor Td, in response to a scan signal that is input through the scan line SL.

The storage capacitor Cst, which is connected to the switching thin film transistor Ts and the driving voltage line PL, stores a voltage corresponding to a difference between a voltage received from the switching thin film transistor Ts and a driving voltage ELVDD supplied to the driving voltage line PL.

The driving thin film transistor Td is connected to the driving voltage line PL and the storage capacitor Cst and may control a driving current flowing from the driving voltage line PL through the organic light-emitting diode OLED, in response to a value of the voltage stored in the storage capacitor Cst. The organic light-emitting diode OLED may emit a light of a luminance in response to the driving current. The organic light-emitting diode OLED may, for example, emit red, green, blue, or white light.

Although a case in which the pixel P includes two thin film transistors and one storage capacitor is described in FIG. 2, the present inventive concept is not limited thereto. In an exemplary embodiment of the present inventive concept, the pixel circuit PC of the pixel P may be variously modified. For example, the pixel circuit PC may include at least three thin film transistors and/or at least two storage capacitors.

Referring back to FIG. 1, the peripheral area PA is arranged at an outer portion of the display area DA. For example, the peripheral area PA may surround the display area DA. The peripheral area PA, in which the pixels P are not arranged, corresponds to a non-display area that does not provide an image.

A drive circuit including, for example, driving units 20 and 22, a terminal portion 40, a driving power supply line 60, and a common power supply line 70 may be disposed in the peripheral area PA. The driving units 20 and 22 may each include, for example, an emission drive circuit, a scan drive circuit, and the like.

The emission drive circuit is disposed in the peripheral area PA of the first substrate 100 and generates an emission control signal and transmits the emission control signal to each pixel P through an emission control line. In an exemplary embodiment of the present inventive concept, the emission drive circuits may respectively be disposed at left and right sides of the display area DA, but the present inventive concept is not limited thereto. In an exemplary embodiment of the present inventive concept, only one emission drive circuit may be provided.

The scan drive circuit is disposed in the peripheral area PA of the first substrate 100, and the scan drive circuit generates a scan signal and transmits the scan signal to each pixel P through the scan line SL. For example, the scan drive circuits may respectively be at left and right sides of the display area DA, but the present inventive concept is not limited thereto. In an exemplary embodiment of the present inventive concept, only one scan drive circuit may be provided.

The terminal portion 40 is disposed at an edge of the first substrate 100 and includes a plurality of terminals 41, 42, 43a, 43b, 44, and 45. The terminal portion 40 is disposed in the peripheral area PA and may be electrically connected to a flexible printed circuit board FPCB without being covered by an insulating layer. The terminal portion 40 may be disposed at a side of the first substrate 100 at which the driving units 20 and 22 are not located. For example, the plurality of terminals 41, 42, 43a, 43b, 44, and 45 may be arranged along a side of the first substrate 100 that extends along the y-direction, whereas the driving units 20 and 22 may be disposed along sides of the first substrate 100 that extend in the x-direction.

The flexible printed board circuit FPCB electrically connects a controller 55 to the terminal portion 40, and a signal or power is transmitted from the controller 55 transfers to connection lines 21, 31, 51, 61, and 71 connected to the terminal portion 40.

The controller 55 receives a vertical synchronizing signal, a horizontal synchronizing signal, and a clock signal and generates a control signal to control driving of the driving units 20 and 22, and the generated control signal may be delivered to the driving units 20 and 22 through the terminal 44 and the connection lines 21 and 31 connected to the flexible printed circuit board FPCB. In addition, through the terminals 42 and 45 and the connection lines 61 and 71 connected to the flexible printed circuit board FPCB, the controller 55 provides the driving voltage ELVDD and a common voltage ELVSS to the driving power supply line 60 and the common power supply line 70, respectively. The driving voltage ELVDD may be provided to each pixel P through the driving voltage line PL connected to the driving power supply line 60, and the common voltage ELVSS may be provided to a common electrode of the pixel P.

A data drive circuit 50 may be disposed on the flexible printed circuit board FPCB. The data drive circuit 50 provides a data signal to each pixel P and may be connected to the terminal portion 40. The data signal of the data drive circuit 50 is provided to each pixel P through the connection line 51 connected to the terminal 41 and the data line DL connected to the connection line 51. In FIG. 1, the data drive circuit 50 is disposed on the flexible printed circuit board FPCB, but the present inventive concept is not limited thereto. In an exemplary embodiment of the present inventive concept, the data drive circuit 50 may be disposed in the peripheral area PA of the first substrate 100.

The driving power supply line 60 may be arranged in the peripheral area PA. For example, the driving power supply line 60 may be disposed between the terminal portion 40 and a side of the display area DA facing the terminal portion 40. The driving voltage ELVDD, which is provided through the connection line 51 connected to the terminal 41, may be provided to each pixel P through the driving voltage line PL.

The common power supply line 70 may be disposed in the peripheral area PA and partially surround the display area DA. For example, the common power supply line 70 has a loop-shape (e.g., a U-shape or a frame shape with an open side) in which a side of the display area DA adjacent to the terminal portion 40 is not surrounded by the common power supply line 70. For example, the common power supply line 70 may extend along edges of the first substrate 100, except an edge at which the terminal portion 40 is located.

The common power supply line 70 is electrically connected to the connection line 71 connected to the terminal 45 and provides the common voltage ELVSS to the common electrode (e.g., a cathode) of the organic light-emitting diode OLED in the pixel P. In FIG. 1, the connection lines 71 are in contact with an end and another end of the common power supply line 70 via contact holes CNT. In an exemplary embodiment of the present inventive concept, the connection line 71 may have a loop-shape that partially surrounds the display area DA. For example, the connection line 71 may not surround one side of the display area DA. In this case, the connection lines 71 may overlap the common power supply line 70 and may extend farther than the common power supply line 70 toward an end of the first substrate 100, for example, the terminal portion 40.

A second substrate 300 facing the first substrate 100 is located above the first substrate 100 that includes the above-mentioned configuration, and a sealing unit 400 disposed is between the first substrate 100 and the second substrate 300. In a top-plan view as shown in FIG. 1, the sealing unit 400 may surround the display area DA. A space formed by the first substrate 100, the second substrate 300, and the sealing unit 400 may be spatially separated from outside, and permeation of external moisture or impurities may be prevented. The sealing unit 400, for example, may include an inorganic material frit, but the present inventive concept is not limited thereto. In an exemplary embodiment of the present inventive concept, the sealing unit 400 may include epoxy and so on. The sealing unit 400 may at least partially overlap the common power supply line 70, and thus, a dead area of the display apparatus 1 may be reduced.

The sealing unit 400 is used for bonding the first substrate 100 and the second substrate 300 to each other. When defects such as exfoliation occur in the sealing unit 400, external moisture may permeate into the display apparatus 1. However, it may be difficult to discover a defect in the sealing unit 400 before humidity permeating into the display apparatus oxidizes the organic light-emitting diode OLED and causes scotoma. In addition, performing complete enumeration on manufactured display apparatuses 1 just to identify the defect in the sealing unit 400 may excessively decrease the manufacturing yield of the display apparatus 1.

However, according to the present inventive concept, by arranging a pair of resistance measuring patterns 80 for measuring the resistance of the sealing unit 400 at the upper surface and the lower surface of the sealing unit 400, defects that occur in the sealing unit 400 may be easily and promptly identified by simply measuring the resistance value of the sealing unit 400.

The pair of resistance measuring patterns 80 that are respectively disposed at the upper surface and the lower surface of the sealing unit 400 may at least partially surround the display area DA, and the terminal portion 40 may be disposed at the open side of the pair of resistance measuring patterns 80.

The terminal portion 40 and the like are located between the sealing unit 400 and an edge of the first substrate 100 that connects to flexible printed circuit board FPCB. In addition, the sealing unit 400 extends adjacent to other edges of the first substrate 100. Accordingly, when an impact is applied to the first substrate 100, at the edge of the first substrate 100 at which the terminal portion 40 is located, it is less likely that the sealing unit 400 may be damaged due to impacts than at the other edges of the first substrate 100. Therefore, the pair of resistance measuring patterns 80, which has a loop-shape in which an edge of the display area DA that is adjacent to the terminal portion 40 is not surrounded by the pair of resistance measuring patterns 80, may extend along the edges of the first substrate 100 except the terminal portion 40.

In an exemplary embodiment of the present inventive concept, the pair of resistance measuring patterns 80 may have a square shape with an open side, from a plan view.

The pair of resistance measuring patterns 80 may be electrically connected to the terminal portion 40. In addition, the pair of resistance measuring patterns 80 may be electrically connected to the flexible printed circuit board FPCB through connection lines 83 and 84 and terminals 43a and 43b. The connection lines 83 and 84 may respectively be connected to two end portions spaced apart from each other. For example, when one connection line 83 is connected to an end portion of a first resistance measuring pattern at the upper surface of the sealing unit 400, the other connection line 84 is connected to an end portion of a second resistance measuring pattern at the lower surface of the sealing unit 400, and the end portion of the first resistance measuring pattern at the upper surface of the sealing unit 400 and the end portion of the second resistance measuring pattern at the lower surface of the sealing unit 400 are the two portions spaced apart from each other by a predetermined distance along the y-direction. For example, the predetermined distance is the greatest or max distance from end to end.

The data drive circuit 50 may measure a resistance of the sealing unit 400 by using the connection lines 83 and 84 and the terminals 43a and 43b. In addition, the data drive circuit 50 may store an initial resistance value of the sealing unit 400 measured right after the sealing unit 400 is formed and compare the stored initial resistance value with a resistance value (e.g., an actual resistance value) of the sealing unit 400, which is the resistance value that is measured later.

For example, after the display apparatus 1 is manufactured, re-measuring a resistance value of the sealing unit 400 is performed, and the re-measured resistance value is compared with the initial resistance value. If the resistance value does not change, it is determined that no defect occurred in the sealing unit 400, and if the resistance value changes, it is determined that a defect occurred in the sealing unit 400. When a defect such as a birdcaging occurs, a crack may occur in the sealing unit 400 and/or a gap may form at a position where the defect occurs. Due to the gap, the measured resistance of the sealing unit 400 may change. Accordingly, a defect occurring in the sealing unit 400 may be identified according to the change in the resistance value of the sealing unit 400.

Hereinafter, the structure of the pixel P will be described in more detail with reference to FIG. 3. A pixel circuit PC and a display device 200 in the pixel P are located on the first substrate 100.

The first substrate 100 may include various materials such as a glass material, a metal material, or a plastic material like polyethylene terephthalate (PET), polyethylene naphthalate (PEN), and/or polyimide. For example, the second substrate 300 may include a transparent material. For example, the second substrate 300 may include various materials such as a glass material, a metal material, or a plastic material like PET, PEN, and/or polyimide. The first substrate 100 and the second substrate 300 may either include a same material or different materials.

A buffer layer 101 may be formed on the first substrate 100. The buffer layer 101 may block foreign materials or moisture from permeating through the first substrate 100. For example, the buffer layer 101 may include an inorganic material such as silicon oxide (SiOx), silicon nitride (SiNx), and/or silicon oxynitride (SiON) and may include a single layer or a multi-layer. The buffer layer 101 may be formed to overlap the display area DA and the peripheral area PA.

A thin film transistor 130, a storage capacitor 140, and a display device 200 (e.g., an organic light-emitting diode OLED), which is electrically connected to the thin film transistor 130 and the storage capacitor 140, may be disposed in the display area DA of the first substrate 100. For example, the thin film transistor 130 shown in FIG. 3 may correspond to the driving thin film transistor Td (see FIG. 2) provided in the pixel circuit PC, and the storage capacitor 140 may correspond to the storage capacitor Cst described with reference to FIG. 2.

The thin film transistor 130 includes a semiconductor layer 134 and a gate electrode 136. The semiconductor layer 134 may include, for example, polysilicon. The semiconductor layer 134 may include a channel area 131, a source area 132, and a drain area 133. The channel area 131 is disposed below the gate electrode 136, and the source area 132 and the drain area 133 are respectively arranged at two opposite sides of the channel area 131 and doped with a higher concentration of an impurity than that of the channel area 131. Here, the impurity may include an N-type impurity or a P-type impurity. For example, the source area 132 and the drain area 133 may be understood as a source electrode and the drain electrode of the thin film transistor 130. In an exemplary embodiment of the present inventive concept, the semiconductor layer 134 may include amorphous silicon or an organic semiconductor material. In an exemplary embodiment of the present inventive concept, the semiconductor layer 134 may include an oxide semiconductor.

In addition, as described above with reference to FIG. 2, the pixel circuit PC may further include the switching thin film transistor Ts (see FIG. 2). In addition, the semiconductor layer 134 of the thin film transistor 130 and a semiconductor layer of the switching thin film transistor Ts (see FIG. 2) may include different materials. For example, among the semiconductor layer 134 of the thin film transistor 130 and the semiconductor layer of the switching film transistor Ts (see FIG. 2), one may include a semiconductor layer and the other may include polysilicon. However, the present inventive concept is not limited thereto; for example, the semiconductor layer 134 of the thin film transistor 130 and the semiconductor layer of the switching film transistor Ts may include the same material as each other.

A gate insulating layer 103 may be disposed between the semiconductor layer 134 and the gate electrode 136. For example, the gate insulating layer 103 may include an inorganic insulating layer such as SiON, SiOx, and/or SiNx, and the inorganic insulating layer may include a single layer or a multi-layer.

The storage capacitor 140 includes a lower electrode 144 and an upper electrode 146 overlapping the lower electrode 144. A first interlayer insulating layer 105 may be disposed between the lower electrode 144 and the upper electrode 146.

The first interlayer insulating layer 105, which has permittivity, may include an inorganic insulating layer including SiON, SiOx, and/or SiNx, and may include a single layer or a multi-layer. In FIG. 3, the storage capacitor 140 overlaps the thin film transistor 130, and a lower electrode 144 is the gate electrode 136 of the thin film transistor 130, but the present inventive concept is not limited thereto. In an exemplary embodiment of the present inventive concept, the storage capacitor 140 might not overlap the thin film transistor 130, and the lower electrode 144 may be an independent element separate from the gate electrode 136 of the thin film transistor 130.

The storage capacitor 140 may be covered by a second interlayer insulating layer 107. The second interlayer insulating layer 107 may include an inorganic insulating layer such as SiON, SiOx, and/or SiNx and may include a single layer or a multi-layer.

The driving voltage line PL may be on a first organic insulating layer 111. The driving voltage line PL, which may include, for example, aluminum (Al), copper (Cu), titanium (Ti), and the like, may include a multi-layer or a single layer. For example, the driving voltage line PL may include a multi-layer structure of Ti/Al/Ti.

Figure 3:
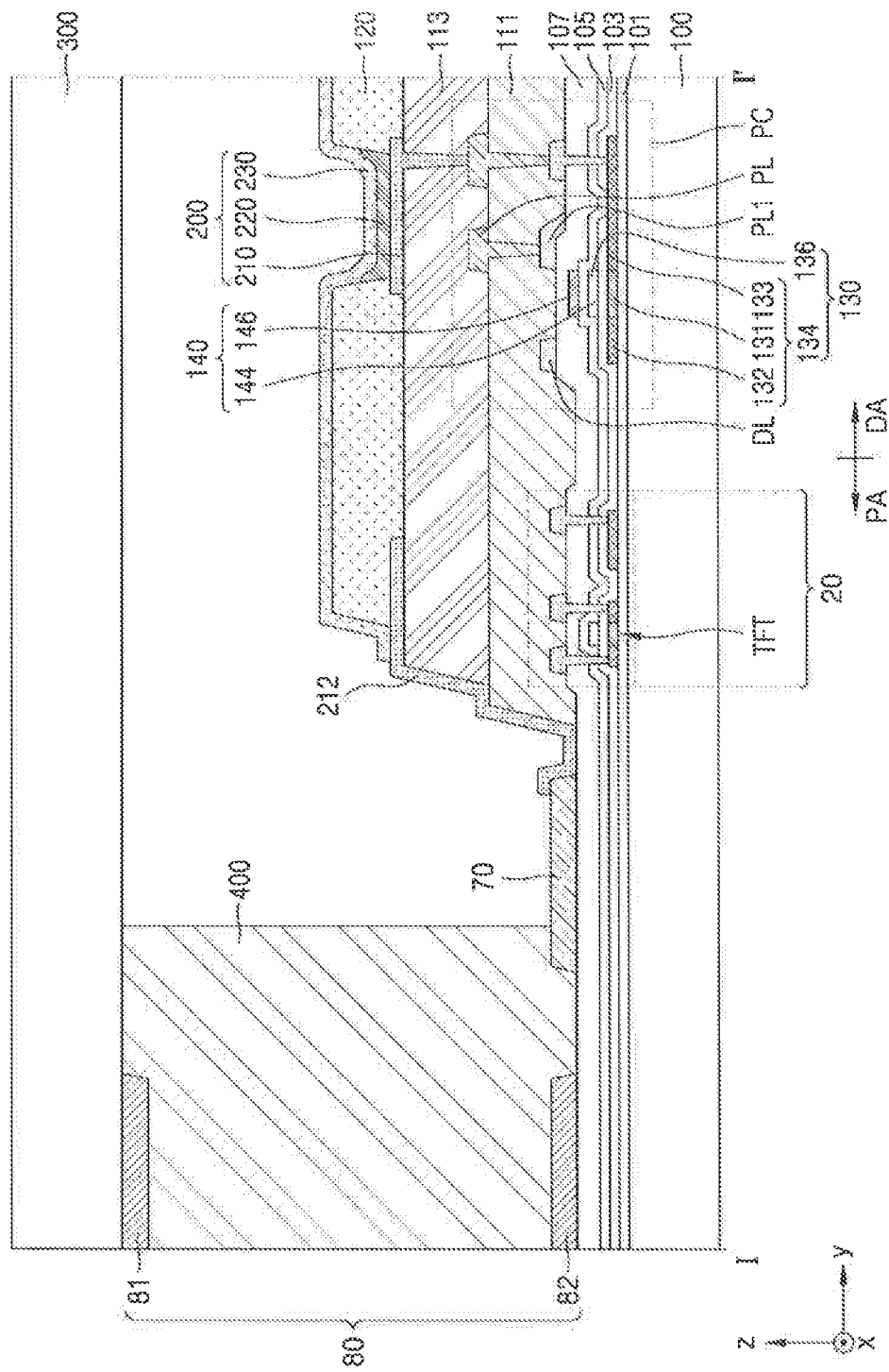
FIG. 3 is a schematic cross-sectional view taken along line I-I' shown in FIG. 1, according to an exemplary embodiment of the present inventive concept.

In FIG. 3, a lower driving voltage line PL1 is disposed under the first organic insulating layer 111. The lower driving voltage line PL1 is electrically connected to the driving voltage line PL via a contact hole penetrating through the first organic insulating layer 111, thereby preventing voltage drop of the driving voltage ELVDD provided through the driving voltage line PL. The lower driving voltage line PL1 may include a material substantially identical to that of the data line DL. For example, the lower driving power voltage line PL1 and the data line DL may include Al, Cu, Ti, and the like and may include a multi-layer or a single layer. In an exemplary embodiment of the present inventive concept, the lower driving voltage line PL1 and the data line DL may include a multi-layer structure such as Ti/Al/Ti or TiN/Al/Ti.

The first organic insulating layer 111 includes an organic insulating material. The organic insulating material may include a general purpose polymer such as poly(methyl methacrylate) (PMMA) or polystyrene (PS), a polymer derivative having a phenol group, an acryl-based polymer, an aryl ether-based polymer, an amide-based polymer, a fluorine-based polymer, a p-xylene based polymer, a vinyl alcohol-based polymer, and a blend thereof. In an exemplary embodiment of the present inventive concept, the first organic insulating layer 111 may include polyimide.

The driving voltage line PL is covered by a second organic insulating layer 113, and the second organic insulating layer 113 may include an imide-based polymer, a general purpose polymer such as PMMA or PS, a polymer derivative having a phenol group, an acryl-based polymer, an aryl-ether based polymer, an amide-based polymer, a fluorine-based polymer, a p-xylene polymer, a vinyl alcohol-based polymer, and a blend thereof. In an exemplary embodiment of the present inventive concept, the second organic insulating layer 113 may include polyimide.

A pixel electrode 210 is arranged on the second organic insulating layer 113. A pixel defining layer 120 is disposed on the pixel electrode 210 and may provide an area for an emission layer by including an opening corresponding to a pixel. For example, the opening may expose at least a center portion of the pixel electrode 210. In addition, the pixel defining layer 120 may increase a distance between an edge of the pixel electrode 210 and the common electrode 230, thereby preventing an arc and so on from being generated between the edge of the pixel electrode 210 and the common electrode 230. The pixel defining layer 120 may, for example, include an organic material such as polyimide or hexamethyldisiloxane (HMDSO).

The intermediate layer 220 may include a low molecular weight material or a high molecular weight material. When the intermediate layer 220 includes a low molecular weight material, the intermediate layer 220 may include a structure in which a hole injection layer (HIL), a hole transport layer (HTL), an emission layer (EML), an electron transport layer (ETL), an electron injection layer (EIL), and the like are stacked in a single or complex structure, and may include various organic materials such as copper phthalocyanine (CuPc), N,N'-Di(naphthalene-1-yl)-N,N'-diphenyl-benzidine (NPB), and tris-8-hydroxyquinoline aluminum (Alq3). The above-mentioned layers may be formed in a vacuum deposition method.

For example, when the intermediate layer 220 includes a high molecular weight material, the intermediate layer 220 may include an HTL and an EML. In this case, the HTL may include PEDOT, and the EML may include a high molecular weight material such as a poly-phenylenevinylene based material or a polyfluorene based material. A structure of the intermediate layer 220 is not limited thereto, and the intermediate layer 220 may have various structures. For example, at least one of the above-mentioned layers included in the intermediate layer 220 may be integrally formed over a plurality of pixel electrodes 210. In addition, the intermediate layer 220 may include layers that are patterned to respectively correspond to the plurality of pixel electrodes 210.

The common electrode 230 may be disposed above the display area DA so as to cover the display area DA. In other words, the common electrode 230 may be integrally formed to cover the plurality of pixels. For example, the common electrode 230 may be disposed on the intermediate layer 220.

A filling material may be disposed between the common electrode 230 and the second substrate 300. The filling material may, for example, include at least one of a photo-curable epoxy-based material and/or an acrylate-based material, but the present inventive concept is not limited thereto.

The driving unit 20, the common power supply line 70, and the like may be disposed in the peripheral area PA of the first substrate 100.

The driving unit 20 may include thin film transistors TFT and lines connected thereto. The thin film transistor TFT may be manufactured in a same process as that of the thin film transistor 130 of the pixel circuit PC.

The common power supply line 70 may include a material substantially identical to that of the driving voltage line PL. For example, the common power supply line 70 may include a multi-layer structure of Ti/Al/Ti. An outer end portion (e.g., a portion furthest from display device 200) of the common power supply line 70 may be covered by the sealing unit 400, and an inner end portion (e.g., portion nearest the display device 200), which is opposite the outer end portion, may be covered by a conductive layer 212. The conductive layer 212 may include a material substantially identical to that of the pixel electrode 210. The conductive layer 212 may be connected to the common electrode 230. In exemplary embodiment of the present inventive concept, the common power supply line 70 may extend toward the display area DA and be in direct contact with the common electrode 230.

The sealing unit 400 bonds the first substrate 100 and the second substrate 300 to each other. The sealing unit 400 may include frit, epoxy, and the like. The frit may be a paste including a material such as SiO and the like. For example, the frit may further include an absorption material for absorbing a laser or an infrared ray, an organic binder, a filler for reducing the coefficient of thermal expansion, and the like. Through drying and plasticity processes, the organic binder and moisture may be removed from the frit in a paste state, and thus, the frit may be cured. An absorption material absorbing a laser or an infrared ray may include, for example, a transition metal compound. For example, frit may be cured by a laser or the like to form the sealing unit 400.

The sealing unit 400 may cover an outer end portion of the common power supply line 70 and be in direct contact with a portion of the common power supply line 70. For example, the sealing unit 400 may overlap a portion of the common power supply line 70. Accordingly, compared to another case in which the sealing unit 400 is located outside of the common power supply line 70 (e.g., not overlapping the common power supply line 70), a dead area of the display apparatus may be reduced by covering the common power supply line 70 with the sealing unit 400.

The pair of resistance measuring patterns 80 may be respectively at the upper surface and the lower surface of the sealing unit 400. For example, a first resistance measuring pattern 81 may be between the second substrate 300 and the upper surface of the sealing unit 400, and a second resistance measuring pattern 82 may be between the first substrate 100 and the lower surface of the sealing unit 400, The first resistance measuring pattern 81 and the second resistance measuring pattern 82 may each extend from an outer surface of the sealing unit 400 toward the display area DA, and accordingly, at least whether defects occur at outer edges of the sealing unit 400 may be identified. For example, the outer edges and the outer surface of the sealing unit 400 may be adjacent to the edges of the first substrate 100. Therefore, when an external impact forms cracks or exfoliation of the sealing unit 400 that start from an outer portion, adjacent the edge of the first substrate 100, of the sealing unit 400 but do not completely penetrate of the sealing unit 400, the cracks or exfoliation may be detected before external moisture permeates from outside into the display area DA. Thus, defects that may occur in the sealing unit 400 may be checked in advance before external moisture permeates from outside into the display area DA.

In addition, as it is described above, the sealing unit 400 may overlap a portion of the common power supply line 70, and therefore, to prevent a short circuit between the common power supply line 70 and the second resistance measuring pattern 82 located at a same layer, a width of the second resistance measuring pattern 82 may be smaller than the width of the sealing unit 400. For example, the sealing unit 400 may be disposed between the common power supply line 70 and the second measuring resistance pattern 82. Accordingly, the common power supply line 70 and the second resistance measuring pattern 82 may be apart from each other. In addition, a width of the first resistance measuring pattern 81 may be substantially identical to a width of the second resistance measuring pattern 82. In an exemplary embodiment of the present inventive concept, unlike FIG. 3, the width of the first resistance measuring pattern 81 may be substantially identical to the width of the sealing unit 400, and thus, a resistance over an entire portion of the sealing unit 400 may be measured.

The first resistance measuring pattern 81 and the second resistance measuring pattern 82 may each include a metal material. For example, the first resistance measuring pattern 81 and the second resistance measuring pattern 82 may each include a material substantially identical to that of the driving voltage line PL.

Figure 4:
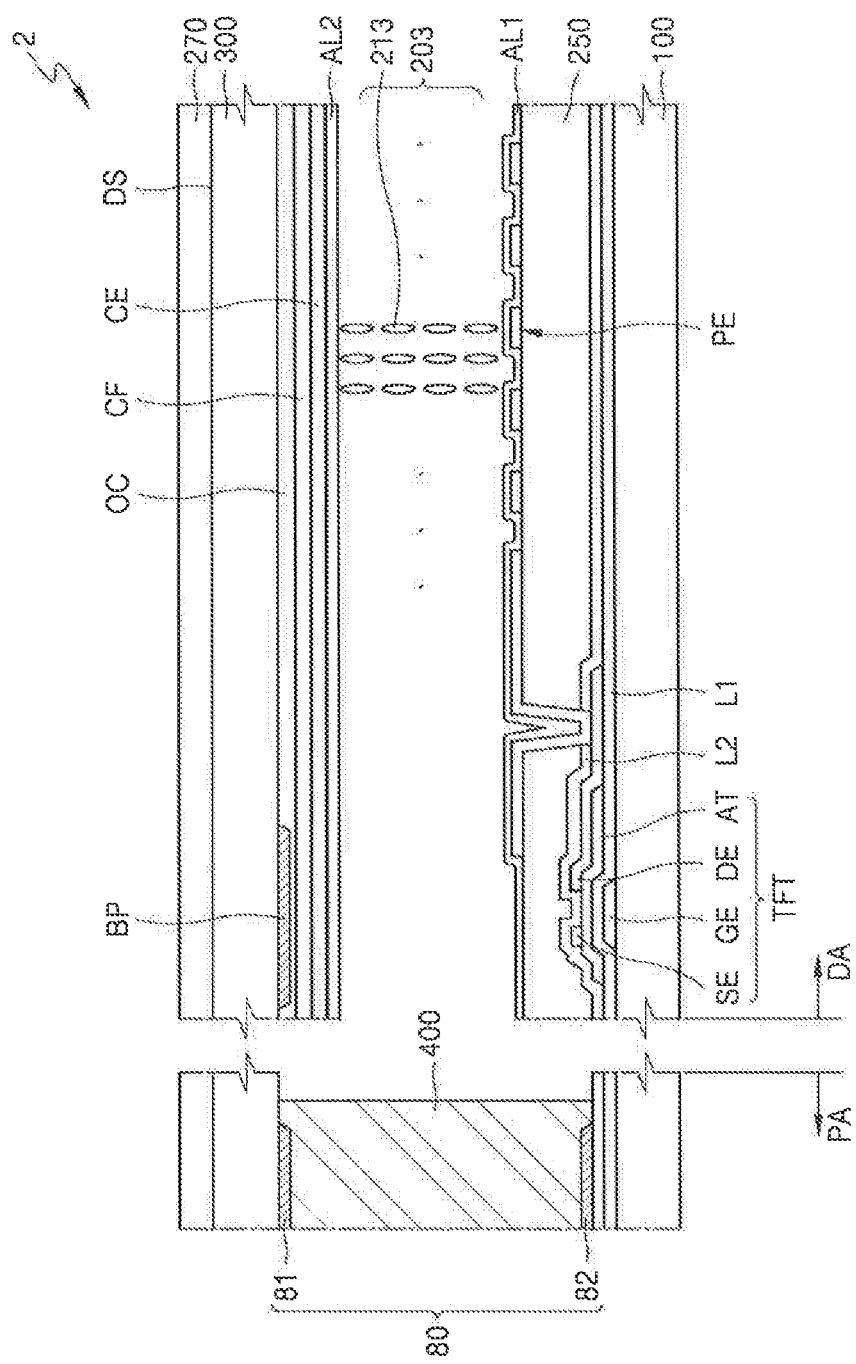
FIG. 4 is a schematic cross-sectional view of a display apparatus, according to an exemplary embodiment of the present inventive concept.

FIG. 4 is a schematic cross-sectional view of a display apparatus 2 according to an exemplary embodiment of the present inventive concept.

Referring to FIG. 4, the second substrate 300 facing the first substrate 100 is disposed above the first substrate 100, and the sealing unit 400 is disposed in the peripheral area PA between the first substrate 100 and the second substrate 300. The sealing unit 400 may surround the display area DA. A space provided between the first substrate 100, the second substrate 300, and the sealing unit 400 may be spatially separated from outside to prevent external moisture or impurities from permeating into the display apparatus 2.

A thin film transistor (TFT) array layer, a pixel electrode PE, and a first orientation layer AL1 may be formed on the first substrate 100. For example, the first substrate 100 may include a glass substrate and may also include a plastic substrate including PET, PEN, polyimide, and the like.

The TFT array layer includes a switching device TFT, a plurality of gate lines, and a plurality of data lines. The switching device TFT, which is a thin film transistor, includes an active layer AT, a gate electrode GE, a source electrode SE, and a drain electrode DE.

A first insulating layer L1, which is a gate insulating layer, is formed on the gate electrode GE, and the active layer AT is formed on the first insulating layer L1. The gate electrode GE and the source electrode SE and a second insulating layer L2 are formed on the active layer AT. The gate electrode GE and the source electrode SE are spaced apart from each other, and the second insulating layer L2 covers the gate electrode GE and the source electrode SE. FIG. 4 illustrates a bottom gate-type thin film transistor in which the gate electrode GE is disposed below the active layer AT, but the present inventive concept is not limited thereto, and various types of thin film transistors, for example, a top gate-type transistor, in which the gate electrode GE is disposed on the active layer AT, may be used.

The active layer AT may include various materials. For example, the active layer AT may include an inorganic semiconductor material such as amorphous silicon or crystalline silicon. As another example, the active layer AT may include an oxide semiconductor. As another example, the active layer AT may include an organic semiconductor material.

The gate electrode GE, the source electrode SE, and the drain electrode DE may each include, for example, a single layer or a multi-layer including at least one of Al, platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), Ti, tungsten (W), and/or Cu.

The first insulating layer L1 and the second insulating material L2 may each include various kinds of insulating materials. For example, the first insulating layer L1 and the second insulating layer L2 may each include a single layer or a multi-layer structure including at least one of $SiO_2$, SiNx, SiON, $Al_7O_3$, $TiO_2$, $Ta_2O_5$, $HfO_2$, $ZrO_2$, BST, and/or PZT.

A planarization layer 250 may be further provided on the TFT array layer, and the pixel electrode PE is located on the planarization layer 250. The pixel electrode PE is connected to the drain electrode DE of the switching device TFT by penetrating through the planarization layer 250 and the second insulating layer L2. The first orientation layer AL1 for orientation of liquid crystal molecules 213 may be formed on the pixel electrode PE.

A blocking pattern BP, a color filter CF, an overcoating layer OC, and a common electrode CE are formed on the second substrate 300, and a second orientation layer AL2 for orientation of the liquid crystal molecules 213 may be formed on the common electrode CE.

For example, the second substrate 300 may include a glass substrate or a transparent plastic substrate, and an outer surface of the second substrate 300 is a display surface DS.

The blocking pattern BP is located on the second substrate 300, at a position corresponding to the area where the switching device TFT, the gate line, and the data lines are formed, and may block light. The position of the blocking pattern BP is only illustrative, and the blocking pattern BP may be on the first substrate 100.

The color filter CF is located on the second substrate 300 and filters color lights. The position of the color filter CF is only illustrative, and the color filter CF may be located on the first substrate 100.

The overcoating layer OC is located on the second substrate 300. For example, the overcoating layer OC may be disposed between the color filter CF and the second substrate 300, and may planarize a surface of the second substrate 300. However, the present inventive concept is not limited thereto.

The common electrode CE is arranged on the second substrate 300 and faces the pixel electrode PE, and a common voltage, which is a reference voltage for providing the polarity of a voltage to be applied to the pixel electrode PE, is applied to the common electrode CE. For example, the common electrode CE may extend parallel to the x and y directions.

A liquid crystal layer 203 includes the liquid crystal molecules 213. In FIG. 4, for example, the liquid crystal layer 203 is a vertical orientation-mode liquid crystal layer, but the present inventive concept is not limited thereto, and the liquid crystal molecules 213 may be oriented in a horizontal direction and be arranged with a twist by 90 degrees between the pixel electrode PE and the common electrode CE.

When a voltage is applied between the pixel electrode PE and the common electrode CE, an electric field is generated and applied to the liquid crystal layer 203, and the electric field changes an arrangement of the liquid crystal molecules 213 and adjusts the amount of light penetrating through the liquid crystal layer 203. Thus, the display apparatus 2 may emit light.

A polarization layer 270 may be disposed on a display surface DS of the second substrate 300. The polarization layer 270 may polarize light emitted by the display apparatus 2.

The pair of resistance measuring patterns 80 may be at the upper surface and the lower surface of the sealing unit 400. For example, the first resistance measuring pattern 81 may be between the second substrate 300 and the upper surface of the sealing unit 400, and the second resistance measuring pattern 82 may be between the first substrate 100 and the lower surface of the sealing unit 400. The first resistance measuring pattern 81 and the second resistance measuring pattern 82 may each extend from the outer surface of the sealing unit 400 toward the display area DA, and accordingly, defects in the sealing unit 400 may be detected. Accordingly, the defects, for example, a crack in the sealing unit 400 may be found before the crack completely penetrates the sealing unit 400.

Figure 5:
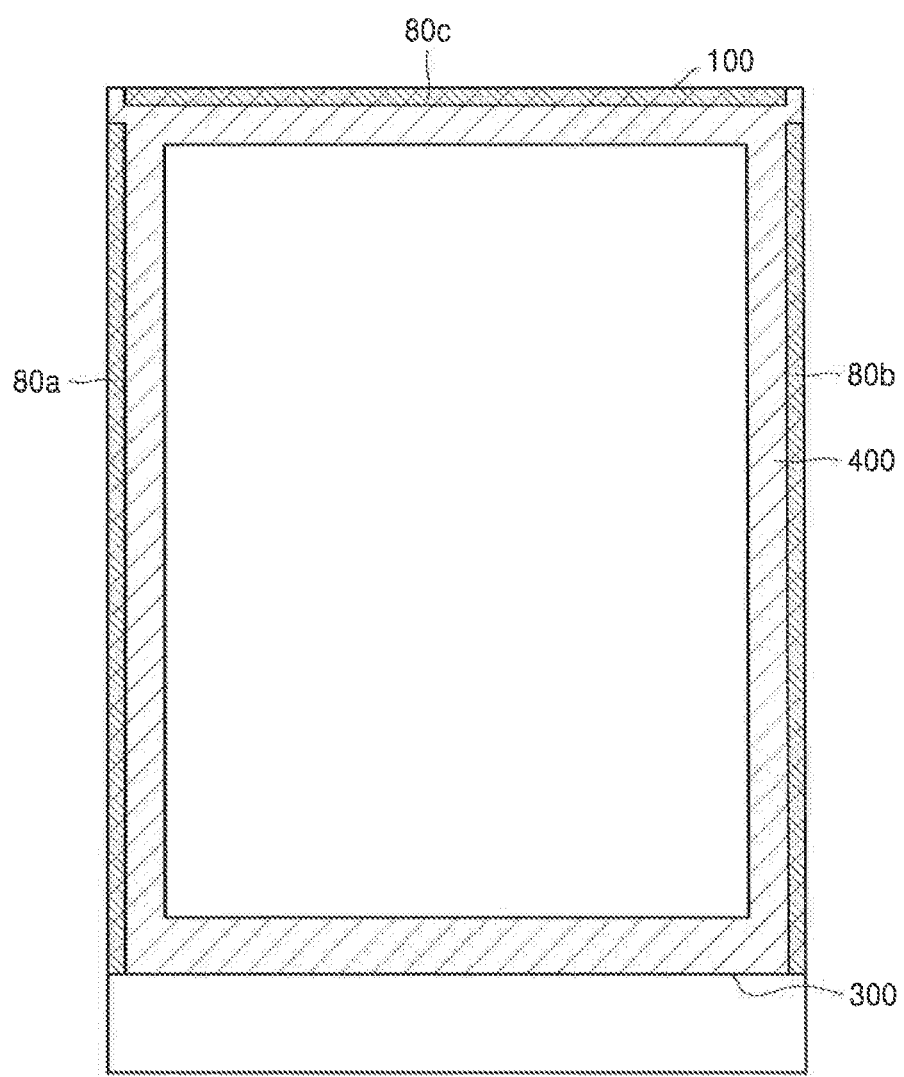
FIG. 5 is a schematic top-plan view illustrating a resistance measuring pattern of the display apparatus shown in FIG. 1, according to an exemplary embodiment of the present inventive concept.

FIG. 5 is a schematic top-plan view illustrating the resistance measuring pattern of the display apparatus 1 shown in FIG. 1, according to an exemplary embodiment of the present inventive concept. For clarity, FIG. 5 illustrates some of elements in the display apparatus 1 of FIG. 1.

Referring to FIG. 5, a pair of resistance measuring patterns may be respectively disposed at the upper surface and the lower surface of the sealing unit 400 located between the first substrate 100 and the second substrate, and as described above, defects occurring in the sealing unit 400 may be identified by using a resistance value of the sealing unit 400 measured by the pair of resistance measuring patterns.

In addition, when the defects that occur in the sealing unit 400, a change in the resistance value of the sealing unit 400 may be detected before visually checking the entire portion of the sealing unit 400. In addition, by visually checking the entire portion of the sealing unit 400, a lot of time may be consumed and a portion of the sealing unit 400 at which the defect occurred may not be identified.

At least one of the pair of resistance measuring patterns may include a plurality of fragments 80a, 80b, and 80c that are separated from one another. Each of the plurality of fragments 80a, 80b, and 80c has a configuration that is substantially identical to that of the resistance measuring pattern 80 (see, e.g., FIG. 1) described above. For example, the plurality of fragments 80a, 80b, and 80c of the pair of resistance measuring patterns may be located at each of the upper surface and the lower surface of the sealing unit 400 and may be used for measuring a resistance of the sealing unit 400. In other words, the first resistance measuring pattern 81 (see FIG. 3) and the second resistance measuring pattern 82 (see FIG. 3) may each include fragments 80a, 80b, and 80c separated from one another. In this case, the fragments 80a, 80b, and 80c of the first resistance measuring pattern 81 (see FIG. 3) and the fragments 80a, 80b, and 80c of the second resistance measuring pattern 82 (see FIG. 3) may correspond with one another. For example, the fragments 80a, 80b, and 80c of the first resistance measuring pattern 81 and the fragments 80a, 80b, and 80c of the second resistance measuring pattern 82 may have the same shape and may overlap one another.

Accordingly, resistances of the sealing unit 400 measured by the plurality of fragments 80a, 80b, and 80c may be resistances of areas in which the first fragment 80a, the second fragment 80b, and the third fragment 80c are respectively located. For example, as shown in FIG. 5, the first substrate 100 may have four corners, and a first fragment 80a, a second fragment 80b, and a third fragment 80c may be respectively at left, right, and upper edges of the first substrate 100. In this case, when only a resistance value measured by using the first fragment 80a is changed, defects in the sealing unit 400 may be detected in a region of the sealing unit 400 in which the first fragment 80a is located, and thus, when identifying the area in which the defect occurred, a search range of the sealing unit 400 may be reduced, and therefore, an inspection time period may be reduced.

Figure 6:
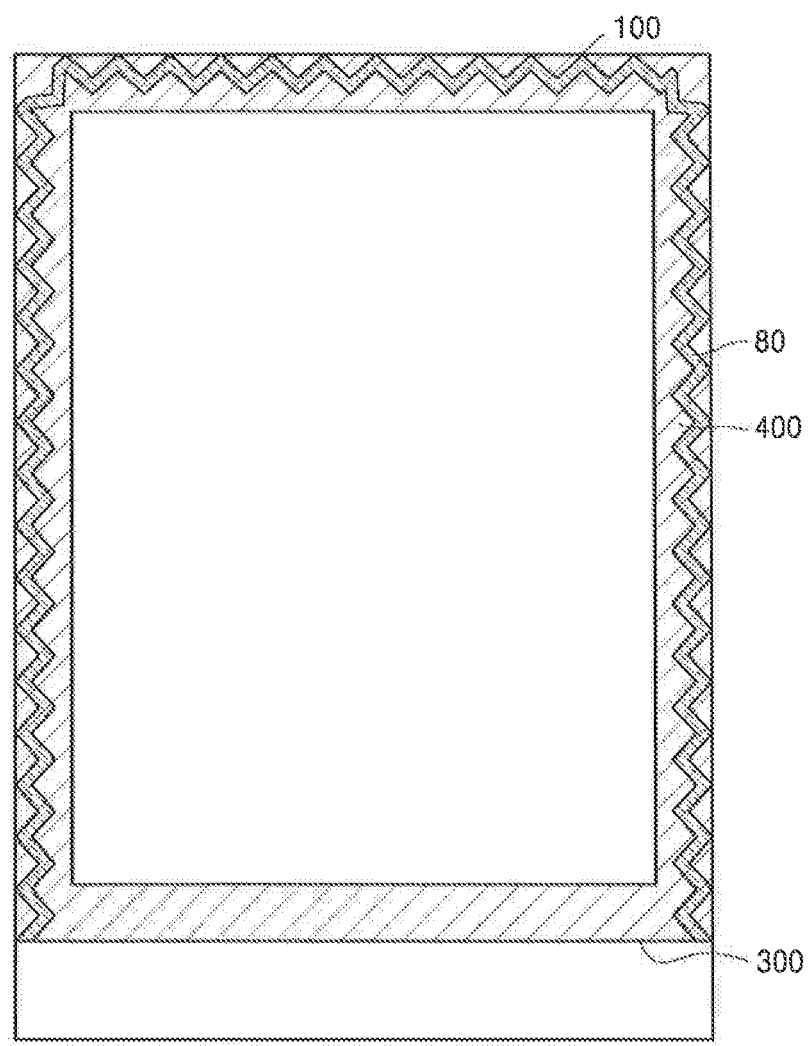
FIG. 6 is a schematic top-plan view illustrating a resistance measuring pattern of the display apparatus shown in FIG. 1, according to an exemplary embodiment of the present inventive concept.
Figure 7:
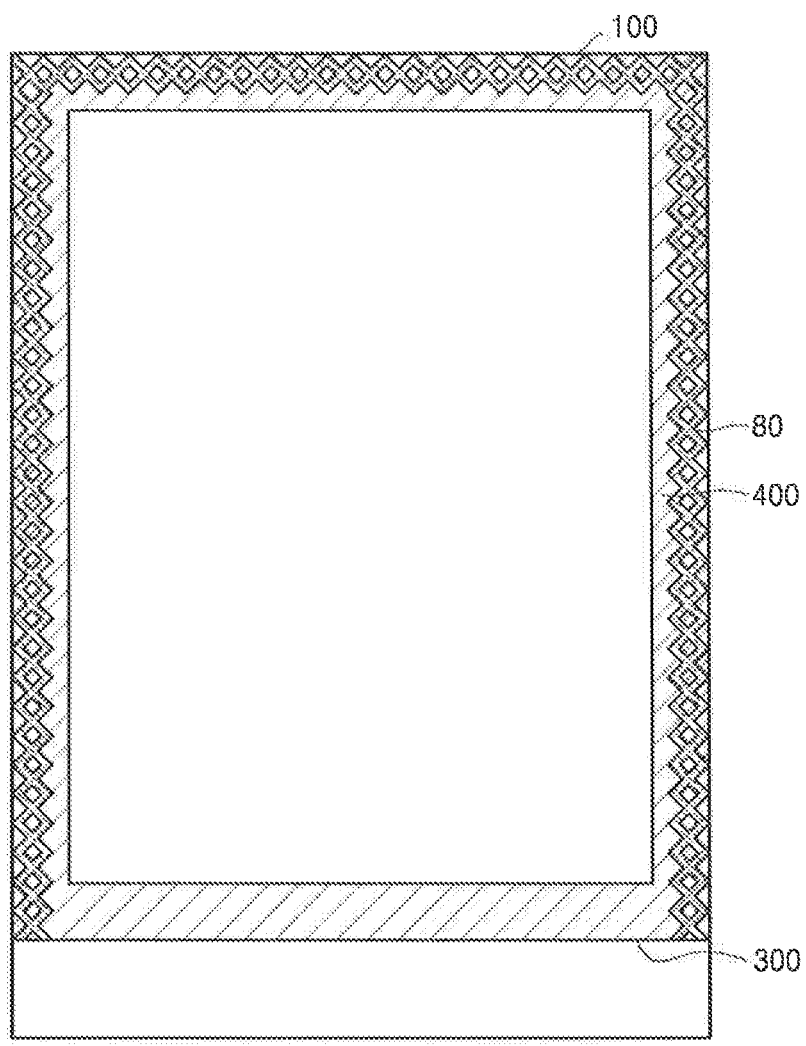
FIG. 7 is a schematic top-plan view illustrating a resistance measuring pattern of the display apparatus shown in FIG. 1, according to an exemplary embodiment of the present inventive concept.
Figure 8:
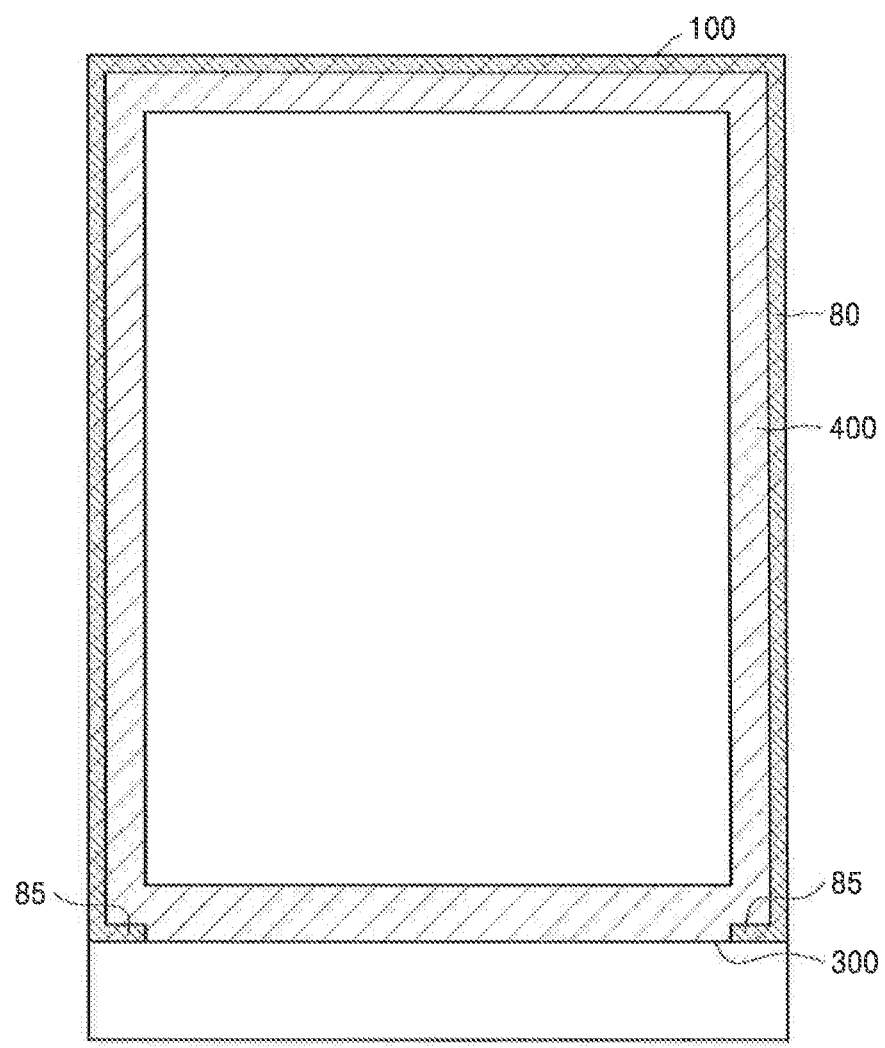
FIG. 8 is a schematic top-plan view illustrating a resistance measuring pattern of the display apparatus shown in FIG. 1, according to an exemplary embodiment of the present inventive concept.

FIGS. 6 through 8 are schematic top-plan views illustrating the resistance measuring patterns in the display apparatus 1 of FIG. 1 according to exemplary embodiments of the present inventive concept. For clarity, FIGS. 6 through 8 illustrate some elements in the display apparatus 1 of FIG. 1.

The resistance measuring patterns of FIGS. 6 and 7 are different from that of FIG. 1. In other words, in FIGS. 6 and 7, the pair of resistance measuring patterns 80 may be respectively disposed at the upper surface and the lower surface of the sealing unit 400 disposed between the first substrate 100 and the second substrate 300, and as described above, the defects occurring in the sealing unit 400 may be identified by using the resistance value of the sealing unit 400 that is measured by the pair of resistance measuring patterns 80.

In addition, in FIGS. 6 and 7, to increase a length of the resistance measuring patterns 80, the resistance measuring patterns 80 do not have a straight-line shape and a bent portion on the plane. For example, in FIG. 6, the resistance measuring pattern 80 has a zigzag pattern or repeatedly alternates between opposing directions, and in FIG. 7, the resistance measuring pattern 80 includes X-letter patterns that are continuously placed. For example, the resistance measuring pattern 80 may include a lattice arrangement extending around the display area DA.

In an exemplary embodiment of the present inventive concept, the resistance measuring pattern 80 may extend around the display area DA and include polygonal shaped spaces.

As described above, when the resistance measuring pattern 80 includes bent portions, a total resistance amount of the resistance measuring pattern 80 increases, and thus, a detection rate for fine exfoliation of the sealing unit 400 may be increased. In addition, as the resistance measuring pattern 80 includes the bent portion, an area occupied by the resistance measuring pattern 80 may increase, and thus, a detection area of the sealing unit 400 may increase.

Compared to the resistance measuring pattern 80 shown in FIG. 1, the resistance measuring pattern 80 shown in FIG. 8 further includes extending portions 85 respectively at two opposite ends. The extending portions 85, which extend from two opposite ends of the resistance measuring pattern 80 toward the terminal portion 40 (see FIG. 1), are separate from the terminal portion 40 (see FIG. 1). When the pair of resistance measuring pattern 80 includes the extending portions 85, the detection area of the sealing unit 400 may increase.

In addition, in FIGS. 6 through 8, the resistance measuring pattern 80 is continuously formed, however, as shown and described in FIG. 5, the display apparatus may include the fragments of the resistance measuring pattern. In addition, the resistance measuring pattern 80 described in FIGS. 6 and 8 may be applied to the display apparatus 1 that is shown and described in FIGS. 1 and 3 and to the display apparatus 2 that is shown and described in FIG. 4.

According to an exemplary embodiment of the present inventive concept, defects occurring in the sealing material may be checked at an early state, and accordingly, the display apparatus may be manufactured with a higher yield. However, the scope of the present inventive concept is not limited to the above-mentioned effects and results.

While the present inventive concept has been particularly shown and described with reference to exemplary embodiments thereof, it will be apparent to those of ordinary skill in the art that various changes in form and detail may be made thereto without departing from the spirit and scope of the present inventive concept as defined by the following claims.

What is claimed is:

1. A display apparatus comprising:
a first substrate including a display area and a peripheral area;
a second substrate overlapping the first substrate;
a sealing unit surrounding the display area and disposed between the first substrate and the second substrate;
a first resistance measuring pattern located at an upper surface of the sealing unit, and a second resistance measuring pattern located at a lower surface of the sealing unit; and
a power supply line extending around the display area, wherein the power supply line is disposed between the first substrate and the sealing unit around the display area,
wherein each of the first and second resistance measuring patterns extends along edges of the first substrate and has a loop shape including an open side,
wherein the second resistance measuring pattern and the power supply line are spaced apart from each other by the sealing unit on the same layer, and
wherein one edge of the power supply line is in contact with the sealing unit and the other edge of the power supply line is in contact with a conductive layer, the sealing unit and the conductive layer being spaced apart from each other.

2. The display apparatus of claim 1, further comprising
a terminal portion arranged at an edge of the first substrate in the peripheral area,
wherein the terminal portion is located at the open side of the first and second resistance measuring patterns.

3. The display apparatus of claim 2, wherein
a data drive circuit is located at the terminal portion, and
the data drive circuit is configured to compare an initial resistance value of the sealing unit with a resistance value measured by using the first and second resistance measuring patterns.

4. The display apparatus of claim 2, wherein
an end portion of the first resistance measuring pattern and an end portion of the second resistance measuring pattern are respectively electrically connected to the terminal portion.

5. The display apparatus of claim 4, wherein
the end portion of the first resistance measuring pattern and the end portion of the second resistance measuring pattern are spaced apart from each other by a predetermined distance.

6. The display apparatus of claim 4, wherein
the first resistance measuring pattern and the second resistance measuring pattern respectively extend from the edges of the first substrate and edges of the second substrate toward the display area.

7. The display apparatus of claim 6, wherein
a width of the second resistance measuring pattern is less than a width of the sealing unit.

8. The display apparatus of claim 6,
wherein the sealing unit covers a portion of the power supply line.

9. The display apparatus of claim 1, wherein
at least one of the first and second resistance measuring patterns comprises a plurality of fragments separated from one another.

10. The display apparatus of claim 1, wherein the first and second resistance measuring patterns each comprises a bent portion.

11. A display apparatus comprising:

a first substrate including a display area, and a peripheral area;

a terminal portion disposed in the peripheral area;

a second substrate disposed on the first substrate;

a sealing unit located between the first substrate and the second substrate and surrounding the display area;

a first resistance measuring pattern located at an upper surface of the sealing unit, and a second resistance measuring pattern located at a lower surface of the sealing unit; and a power supply line extending around the display area, wherein the sealing unit extends on an edge region of the power supply line around the display area, wherein each of the first and second resistance measuring patterns is electrically connected to the terminal portion, wherein the second resistance measuring pattern and the power supply line are spaced apart from each other by the sealing unit on the same layer, and wherein one edge of the power supply line is in contact with the sealing unit and the other edge of the power supply line is in contact with a conductive laver, the sealing unit and the conductive layer being spaced apart from each other.

12. The display apparatus of claim 11, wherein the first and second resistance measuring patterns extends along edges of the first substrate and has a rectangular shape including an open side, and wherein the terminal portion is located at the open side of the first and second resistance measuring patterns.

13. The display apparatus of claim 11, wherein a data drive circuit is located at the terminal portion, and the data drive circuit is configured to compare an initial resistance value of the sealing unit with a resistance value measured by using the first and second resistance measuring patterns.

14. The display apparatus of claim 11, wherein an end portion of the first resistance measuring pattern and an end of the second resistance measuring pattern are electrically connected to the terminal portion, respectively.

15. The display apparatus of claim 14, wherein the end portion of the first resistance measuring pattern and the end portion of the second resistance measuring pattern are spaced apart from each other by a predetermined distance.

16. The display apparatus of claim 14, wherein the sealing unit covers a portion of the power supply line, and the second resistance measuring pattern and the power supply line comprise a same material.

17. The display apparatus of claim 16, wherein the first resistance measuring pattern and the second resistance measuring pattern respectively extend from edges of the first substrate and edges of the second substrate toward the display area.

18. The display apparatus of claim 16, wherein a width of the second resistance measuring pattern is less than a width of the sealing unit.

19. The display apparatus of claim 11, wherein at least one of the first and second resistance measuring patterns comprises a plurality of fragments separated from one another.

20. The display apparatus of claim 11, wherein the first and second resistance measuring patterns each comprises a bent portion.

* * * * *